United States Patent
Kuroki

(10) Patent No.: US 7,548,087 B2
(45) Date of Patent: Jun. 16, 2009

(54) IMPEDANCE ADJUSTING CIRCUIT AND IMPEDANCE ADJUSTING METHOD

(75) Inventor: Kouichi Kuroki, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/492,035

(22) Filed: Jul. 25, 2006

(65) Prior Publication Data
US 2007/0063731 A1    Mar. 22, 2007

(30) Foreign Application Priority Data
Jul. 26, 2005  (JP) .............................. 2005-215606

(51) Int. Cl.
*H03K 19/013*   (2006.01)
*H03K 19/003*   (2006.01)
(52) U.S. Cl. .......................................... 326/30; 326/26
(58) Field of Classification Search .................... 326/30
See application file for complete search history.

(56) References Cited

U.S. PATENT DOCUMENTS

2004/0169525 A1* 9/2004 Kerr ............................ 326/30

FOREIGN PATENT DOCUMENTS

JP   11-177380 A    7/1999

OTHER PUBLICATIONS

Technical Note, New Functions of DDR2 SDRAM, off-Chip Driver (OCD), Jan. 2005, Document No. J05 94E10 (Ver. 1.0) (http://www.elpida.com).

* cited by examiner

*Primary Examiner*—Vibol Tan
*Assistant Examiner*—Matthew C Tabler
(74) *Attorney, Agent, or Firm*—Sughrue Mion, PLLC

(57) ABSTRACT

An impedance adjusting circuit for adjusting an impedance of an output buffer of a DDR2 memory, using an OCD impedance adjusting function, from a side of a memory controller, includes first and second terminals, first and second switches, a comparator, and a control circuit. The DDR2 memory has an OCD impedance adjusting function and includes a first output buffer and a second buffer each having a pull-up buffer and a pull-down buffer that receive an input signal in common and with impedances thereof capable of being variably set. The first and second terminals receive first and second signals output from the first buffer and the second buffers, respectively. The first and second switches are connected between the first terminal and the second terminal in series. The comparator compares a reference voltage VREF with a voltage at a connection node between the first and second switches. The control circuit receives a comparison result from the comparator to perform control for adjustably setting the impedance of the first buffer and/or the impedance of the second buffer, and also performs on/off control of the first and second switches.

11 Claims, 12 Drawing Sheets

Zp1 : IMPEDANCE OF PULL-UP BUFFER (P1)
Zn2 : IMPEDANCE OF PULL-DOWN BUFFER (N2)

Zp1 : IMPEDANCE OF PULL-UP BUFFER (P1)
Zn2 : IMPEDANCE OF PULL-DOWN BUFFER (N2)

Zp1 : IMPEDANCE OF PULL-UP BUFFER (P1)
Zn2 : IMPEDANCE OF PULL-DOWN BUFFER (N2)

10 ; MEMORY CONTROLLER

20; DDR2 MEMORY (DIMM)

IMPEDANCE ADJUSTING CIRCUIT AND IMPEDANCE ADJUSTING METHOD

FIELD OF THE INVENTION

The present invention relates to an impedance adjusting circuit and an impedance adjusting method.

BACKGROUND OF THE INVENTION

The present invention is suitably applied to impedance adjustment of an output buffer of a DDR (Double Data Rate) 2 memory having an OCD (Off-Chip Driver) impedance adjusting function in a memory interface. A background art of the present invention will be described below.

As a conventional approach to OCD impedance adjustment, the impedance adjustment of an output buffer of a memory controller connected to the DDR2 memory will be described below. In the case of the output buffer of the memory controller, there is no influence of a series resistance on a package (PKG)/system board/DIMM (Dual Inline Memory Module) and hence the impedance adjustment can be performed with relative ease. A method of adjusting an impedance of an output buffer in a memory controller 10 shown in FIG. 11 will be described. FIG. 12A through FIG. 12C are diagrams for explaining the impedance adjustment of the output buffer A in FIG. 11.

As shown in FIG. 12A, in an impedance circuit, a resistance R11 is inserted between a power supply VCC and a node 101, which is an output node of the output buffer A, through a switch SW11. A value obtained by adding a resistance value of the switch SW11 to a resistance value of the resistance R11 becomes a value of a pull-down buffer N11 constituted from an Nch MOS transistor after the impedance adjustment. Likewise, a resistance R12 is inserted between the node 101 and a GND through a switch SW12. A value obtained by adding a resistance value of the switch SW12 to a resistance value of the resistance R12 becomes a value of a pull-up buffer P11 constituted from a Pch MOS transistor after the impedance adjustment. Further, a voltage at the node 101 is supplied to an impedance control circuit 102 together with a reference voltage VREF, for comparison. According to a result of the comparison, a control signal S21 for increasing or reducing buffer size of the pull-up buffer or the pull-down buffer is input to the output buffer A, thereby performing feedback control.

As shown in FIG. 12B, at the time of the impedance adjustment of the pull-up buffer P11, the Nch MOS transistor N11 and the switch SW11 are turned off, and the Pch MOS transistor P11 and the switch SW12 are turned on.

When the voltage at the node 101 is higher than the reference voltage (reference voltage) VREF, the adjustment is made so that the buffer size of the pull-up buffer P11 is reduced in order to increase the impedance of the pull-up buffer 11. When the voltage at the node 101 is lower than the reference voltage (reference voltage) VREF, the adjustment is made so that the buffer size of the pull-up buffer P11 is increased in order to reduce the impedance of the full-up buffer P11.

On the other hand, at a time of the impedance adjustment of the pull-down buffer N11 as shown in FIG. 12C, the pull-up buffer P11 and the switch SW12 are turned off, and the pull-down buffer N11 and the switch SW11 are turned on. When the voltage at the node 101 is higher than the reference voltage VREF, the adjustment is made so that the buffer size of the pull-down buffer N11 is increased in order to reduce the impedance of the pull-down buffer N11.

When the voltage at the node 101 is lower than the reference voltage VREF, the adjustment is made so that the buffer size of the pull-down buffer N11 is reduced in order to increase the impedance of the pull-down buffer N11.

By repeating these series of operations until the voltage at the node 101 becomes the same as the reference VREF, the impedance adjustment of the pull-up buffer P11 or the impedance adjustment of the pull-down buffer NI1 is performed.

The pull-up buffer P11 has a configuration in which a plurality of arbitrary sized Pch MOS transistors are connected in parallel so that the buffer size thereof can be increased or decreased. The pull-down buffer N11 has a configuration in which a plurality of arbitrary sized Nch MOS transistors are connected in parallel so that the buffer size thereof can be increased or decreased. The number of transistors to be connected is controlled by the control signal S21. A channel resistance of each Pch MOS transistor constituting the pull-up buffer P11 is proportional to the reciprocal of the W/L (where W indicates a channel width, and L indicates a channel length). When the channel width W is set to be large (accordingly, when the buffer size is set to be large, by increasing the number of connection of the Pch MOS transistors constituting the pull-up buffer P11 in parallel, for example), the impedance of the pull-up buffer P11 is reduced. When the channel width W is set to be small (when the buffer size is set to be small, by reducing the number of the Nch MOS transistors constituting the pull-up buffer P11 in parallel, for example), the impedance of the pull-up buffer P11 is increased. A channel resistance of each Nch MOS transistor constituting the pull-down buffer N11 is proportional to the reciprocal of the W/L (where W indicates the channel width, and L indicates the channel length). When the channel width W is set to be large (when the buffer size is set to be large, by increasing the number of connection of the Nch MOS transistors constituting the pull-down buffer N11 in parallel, for example), the impedance of the pull-down buffer N11 is reduced. When the channel width W is set to be small (when the buffer size is set to be small, by reducing the number of the Nch MOS transistors constituting the pull-down buffer N11 in parallel, for example), the impedance of the pull-down buffer NI1 is increased.

The DDR2 memory has a function of adjusting the impedance of the output buffer of the DDR2 memory (referred to as an "OCD impedance adjusting function") by entering into an OCD impedance adjusting mode by an input of a command from an outside. Each OCD mode is set in an extended mode register (1) (EMRS (1)) in a DDR2 SDRAM (Synchronous DRAM), using predetermined bits (such as A7, A8, and A9) of an address signal. In a drive (1) mode, output levels of output signals (DQ, DQS, and DQSB) become preset states. An external device such as the memory controller measures voltage levels of the output signals (DQ, DQS, and DQSB) (more specifically, High levels of the signals DQ and DQS and Low level of the signal DQSB), to check whether a pull-up resistance value has become a target value. In a drive (0) mode, the output levels of the output signals (DQ, DQS, and DQSB) become preset states. The external device such as the memory controller measures the voltage levels of the output signals (DQ, DQS, and DQSB) (more specifically, Low levels of the signals DQ and DQS and High level of the signal DQSB), to check whether a pull-down resistance value has become a target value. An adjustment mode is the mode for adjusting the impedance of the output buffer (output driver). The impedance of the output buffer can be adjusted in 16 stages, for example, and the adjustment is made so that the pull-up resistance and the pull-down resistance of the output signals (DQ, DQS, DQSB) become equal. OCD calibration mode cancellation stops an OCD calibration mode. Setting to an OCD calibration default (in which the impedance of the output driver is set to a default value) is performed. Impedance measurement and comparison are performed by the external device such as the memory controller rather then by the SDRAM. When the drive (1) mode is set, when the pull-up resistance is measured, and when the adjustment needs to be made, the OCD calibration mode cancellation is performed. Then, the adjusting mode is set, the pull-up resistance value (the impedance of the driver) is adjusted, and the OCD calibration mode cancellation is performed. The pull-down resistance is also measured and adjusted (refer to Non-Patent Document 1) similarly.

When the impedance adjustment of the output buffer on the side of DDR2 memory (DIMM) is made, an impedance control circuit needs to be inserted into the memory controller.

However, between the memory controller and the DDR2 memory, series resistance components including a parasitic resistance on each of a package (PKG), a system board, and a DIMM (Dual Inline Memory Module) are present.

Since these series resistance components differ in dependence on a chip set and a memory vendor, identification of the components in a design phase is difficult.

Accordingly, an offset portion of the impedance of the output buffer caused by the series resistance components cannot be eliminated. Thus, under present circumstances, there is no effective impedance adjusting method.

When the impedance of the pull-up output buffer on the side of the DDR2 memory (DIMM) and the impedance of the pull-down output buffer on the DDR2 memory (DIMM) side are different, slew rates of a rise/fall of output signals of the pull-up output buffer and the pull-down output buffer become different.

As an influence caused by this, a voltage at a cross-point between differential strobe signals (DQS, DQSB) for data control, which are specific to the DDR2 memory, may be deviated from a reference voltage VREF (0.5*VCC).

In order to reduce an influence of power supply noise, the output signals from the DDR2 memory are generally amplified (differential amplified) by a differential amplifier that uses the reference voltage VREF in the memory controller. However, when the voltage at the crosspoint between the signals DQS and DQSB is deviated from the reference voltage VREF as described before, this deviation is seen as a jitter in the memory controller, thereby adversely affecting characteristics of the DDR2 memory.

Then, since the DDR2 memory targets a high-speed operation at the frequency of 400 Mbps (with one clock cycle tCK being 5 n sec) or higher, suppression of a jitter component in the DDR2 memory has become an extremely important challenge.

[Patent Document 1]

Japanese Patent Kokai Publication No. JP-A-11-177380

[Non-patent Document 1]

Technical Note, New Functions of DDR2 SDRAM, Off-Chip Driver (OCD), January 2005, Document No. J0594E10 (Ver. 1.0) <Internet: URL "http://www.elpida.com">

SUMMARY OF THE DISCLOSURE

As described above, there is no effective means for making the impedance adjustment of the output buffer in the DDR2 memory, using the OCD impedance adjusting function, from the memory controller side.

When the impedance adjustment of an output buffer D in the DDR2 memory in FIG. 11 is to be performed, the series resistance components on the package/system board/DIMM intervene. Thus, the impedance adjustment based on an absolute value has been made extremely difficult.

When the impedance adjustment of the output buffer in the DDR2 memory cannot be made, an unbalance between the impedances of the pull-up buffer and the pull-down buffer that output the differential strobe signals (DQS, DQSB) for data control, respectively, which are output from the DDR2 memory to the memory controller, is seen as the jitter in the memory controller, thereby adversely affecting the characteristics of the DDR2 memory.

The problems described above are solved by the present invention which is configured as follows.

A circuit according to one aspect of the present invention includes: a circuit for short-circuiting two terminals, which receive a differential signal output from an output pair of a semiconductor device, at the time of impedance adjustment of said semiconductor device, said semiconductor device including an output buffer with an impedance thereof variably controlled for outputting said differential signal; a comparator for comparing a potential at the short-circuited node of said two terminals with a reference voltage; and a circuit performing control for adjusting the impedance of said output buffer based on a comparison result of the comparator.

More specifically, the circuit is an impedance adjusting circuit for adjusting an impedance of a semiconductor device including first and second output buffers for pull-up and pull-down with impedances thereof variably controlled. The impedance adjusting circuit includes:

first and second terminals for receiving first and second signals output from the first and second output buffers, respectively;

first and second switches connected in series between the first and second terminals;

a comparator for comparing a reference voltage with a voltage at a connection node between the first switch and the second switch; and a control circuit for receiving a result of the comparison from the comparator, and performing control for adjustably setting the impedance of the first buffer and/or the impedance of the second buffer and also controlling on and off of the first and second switches.

Preferably, in the present invention, the control circuit turns on the first and second switches at a time of the impedance adjustment.

Preferably, in the present invention, the first and second signals are output from the first and second output buffers in mutually opposite phases, respectively.

Preferably, in the present invention, the semiconductor device includes an OCD (Off-Chip Driver) impedance adjusting function, and the impedances of the first and second output buffers are measured and adjusted using an OCD impedance adjusting mode.

Preferably, in the present invention, the semiconductor device comprises a memory, and from the first and second output buffers of the memory, the first and second signals are connected to the first and second terminals, respectively, through at least one of a package, a system board, and a memory module.

Preferably, in the present invention, the impedance adjusting circuit is included in a memory controller.

Preferably, in the present invention, the first output buffer includes a first pull-up buffer and a first pull-down buffer, the first pull-up buffer and the first pull-down buffer being connected in series between first and second power supplies and receiving a first input signal in common, outputs of the first pull-up buffer and the first pull-down buffer being connected to the first terminal, impedances of the first pull-up buffer and the first pull-down buffer being adjustably controlled. The second output buffer includes a second pull-up buffer and a second pull-down buffer, the second pull-up buffer and the second pull-down buffer being connected in series between the first and second power supplies and receiving a second input signal in common, outputs of the second pull-up buffer and the second pull-down buffer being connected to the second terminal, impedances of the second pull-up buffer and the second pull-down buffer being adjustably controlled.

A method according to other aspect of the present invention is an impedance adjusting method for a semiconductor device including a output buffer for outputting a differential signal from an output pair thereof and with impedances thereof adjustably set, said method comprising the steps of:

short-circuiting two terminals that receive the differential signal from said output buffer, at a time of the impedance adjustment;

comparing a potential at a short-circuited node with a reference voltage; and performing control for adjusting an impedance of said output buffer based on a result of the comparison.

The meritorious effects of the present invention are summarized as follows.

According to the present invention, impedance adjustment of the output buffer in the DDR2 memory or the like from a side of the memory controller is facilitated.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

The preferred embodiments of the present invention with be described with reference to appended drawings. In the present invention, by comparing impedances of a pull-up output buffer and a pull-down output buffer using complementary output signals such as differential strobe signals (DQS, DQSB) for data control from a DDR2 memory side, using an OD impedance adjusting function of a DDR2 memory, relative impedance adjustment is made. Since the relative impedance adjustment is made, series resistance components on the package/system board/DIMM are compensated and prohibited from influencing the impedance adjustment.

Generally, lengths of wiring for important signals that determine an operating speed of a system, such as a data signal (DQ) and the differential strobe signals (DQS, DQSB) for data control, are made equal on the package/system board/DIMM so that delays thereof are equal.

Figure 1:
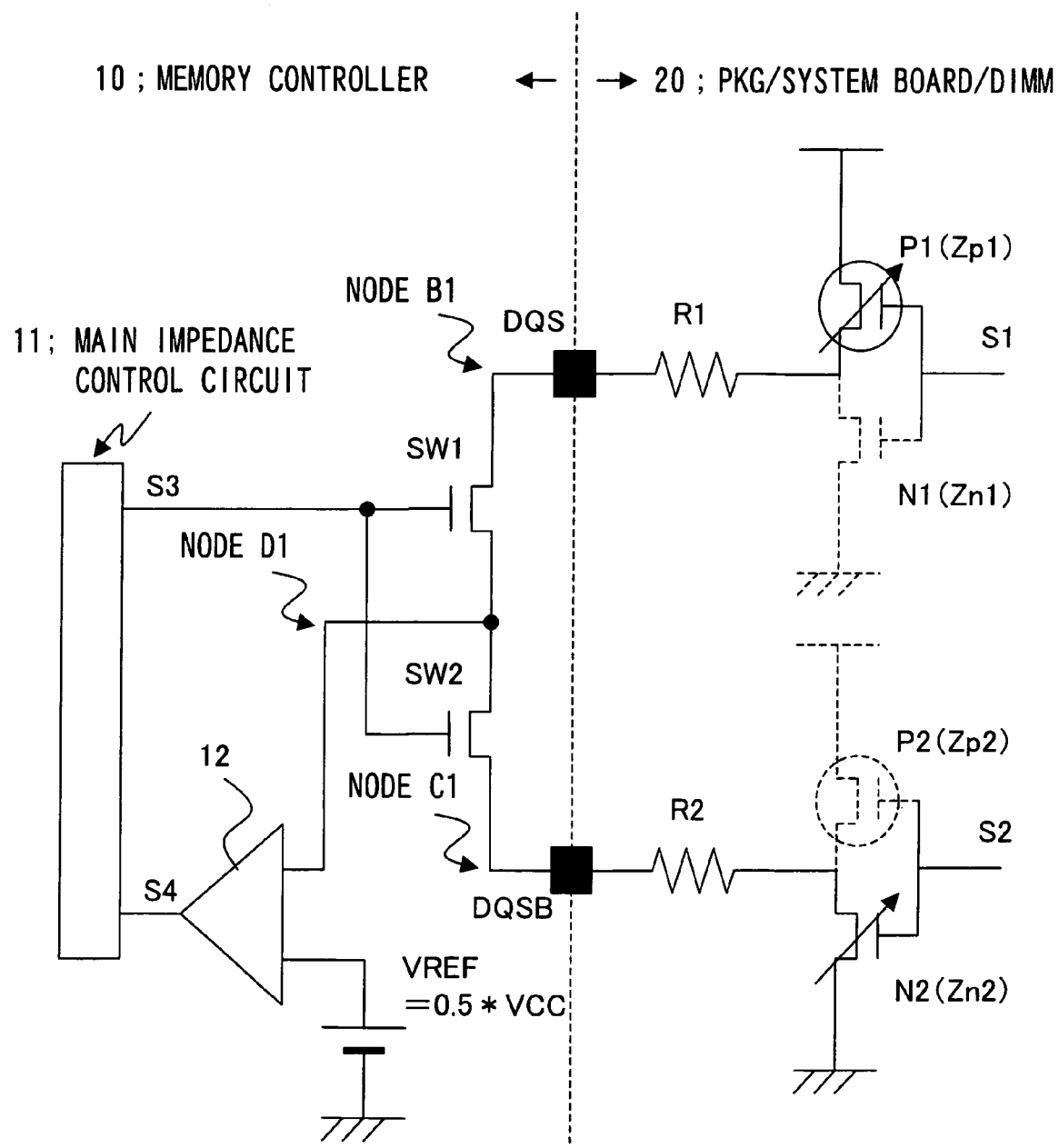
FIG. 1 is a diagram showing a circuit configuration of a first embodiment of the present invention.

FIG. 1 is a diagram showing a configuration of an embodiment of the present invention. As shown in FIG. 1, a memory controller 10 of the present embodiment includes a switch SW1, a switch SW2, a comparator 12, and a main impedance adjusting circuit 11. The switch SW1 is constituted from an Nch MOS transistor connected between a node D1 and an internal node B1 that is connected to a DQS terminal. The switch SW2 is constituted from an Nch MOS transistor connected between the node D1 and an internal node C1 that is connected to a DQSB terminal. The node D1 is the connection point between the switches SW1 and SW2. Input terminals of the comparator 12 are connected to a reference voltage VREF (0.5*VCC) and the node D1, and the comparator 12 performs voltage comparison. The main impedance adjusting circuit 11 inputs a signal S4 indicating a comparison result of the comparator 12 and outputs a signal S3 for on/off controlling of the switches SW1 and SW2. The main impedance adjusting circuit 11 makes buffer-size adjustment of output buffers of a DDR2 memory. Meanwhile, in FIG. 1, input/output buffers in the memory controller 10 which are connected to the terminal DQS and DQSB, respectively, are not shown.

A description will be given, taking a case where a DQS output is and a DQSB output, from the DDR2 memory (package/system board/DIMM) are High and Low, respectively, as shown in FIG. 1, as an example. In this case, an extended mode register (EMRS) (1) of the DDR2 memory, not shown is set to a drive (1) mode of an OCD impedance measuring mode, a DQ output and the DQS output are set to a High level, and the DQSB output is set to a Low level. This state is held until an OCD calibration cancellation is input. When setting to a drive (0) mode is performed, the DQ and DQS outputs are set to a Low level, and the DQSB output is set to a High level. This state is held until the OCD calibration cancellation is input.

When an OCD impedance adjusting mode of the DDR2 memory is entered, the signal S3 from the main impedance control circuit 11 is set to a High level, and the switches SW1 and SW2 are turned on. More specifically, when the memory controller 10 is notified by a CPU not shown of the entry of OCD impedance adjusting mode of the DDR2 memory, the memory controller 10 sends the entry command to the DDR 2 memory and the main impedance control circuit 11 activates the signal S3.

It is a common practice to make the lengths of wiring for data system signals such as the data signal DQ and the data strobe signal DQS/DQSB on a PKG/system board/DIMM 20 equal. Accordingly, a series resistance R1 between a drain of a Pch MOS transistor constituting a pull-up buffer P1 and the DQS terminal of the memory controller 10 is equivalent to a series resistance R2 between a drain of the Nch MOS transistor of a pull-down buffer N2 and the DQSB terminal of the memory controller 10. Meanwhile, in FIG. 1, the pull-down buffer N1 and the pull-up buffer P2 are turned off.

A voltage at the node D1 becomes 0.5*VCC when an impedance Zp1 of the pull-up buffer P1 is the same as an impedance Zn2 of the pull-down buffer N2.

When the impedance Zp1 of the pull-up buffer P1 is different from the impedance Zn2 of the pull-down buffer N2, the voltage at the node D1 does not become 0.5*VCC. The voltage at the node D1 can assume the following three values in view of a relationship between the impedances of the buffers P1 and N2.

If the impedance Zp1 of the pull-up buffer P1 is equal to the impedance Zn2 of the pull-down buffer N2, the voltage at the node D1 is equal to 0.5*VCC.

If the impedance Zp1 of the pull-up buffer P1 is greater than the impedance Zn2 of the pull-down buffer N2, the voltage at the node D1 is less than 0.5*VCC.

If the impedance Zp1 of the pull-up buffer P1 is less than the impedance Zn2 of the pull-down buffer N2, the voltage at the node D1 is greater than 0.5*VCC.

Figure 6:
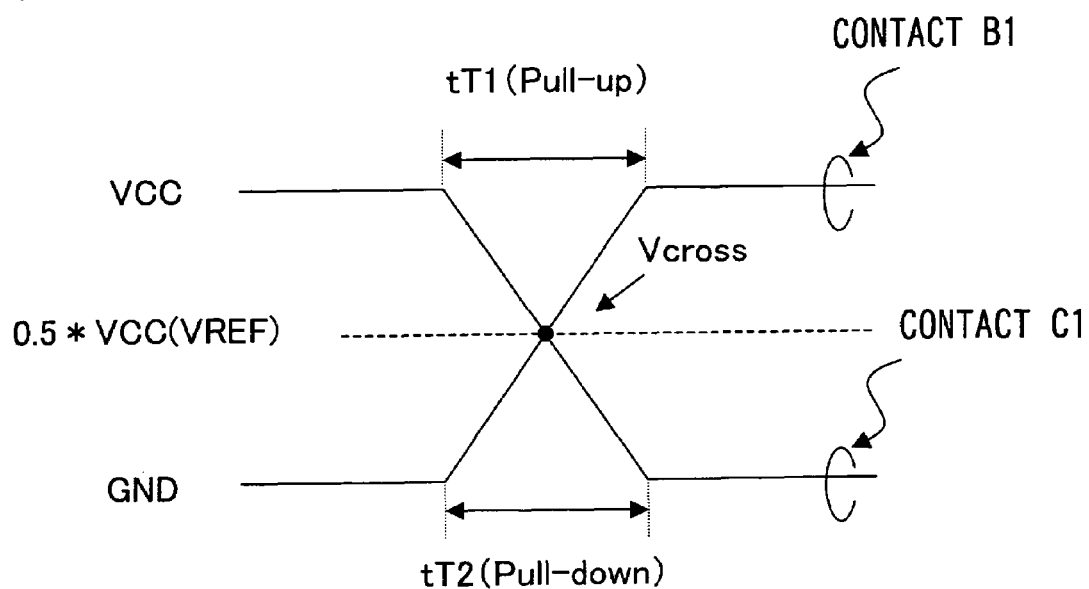
FIG. 6 is a diagram showing changes in voltages at a node B1 and a node C1 when an impedance Zp1 of a buffer P1 is equal to an impedance Zn2 of a buffer N2 in FIG. 1.
Figure 7:
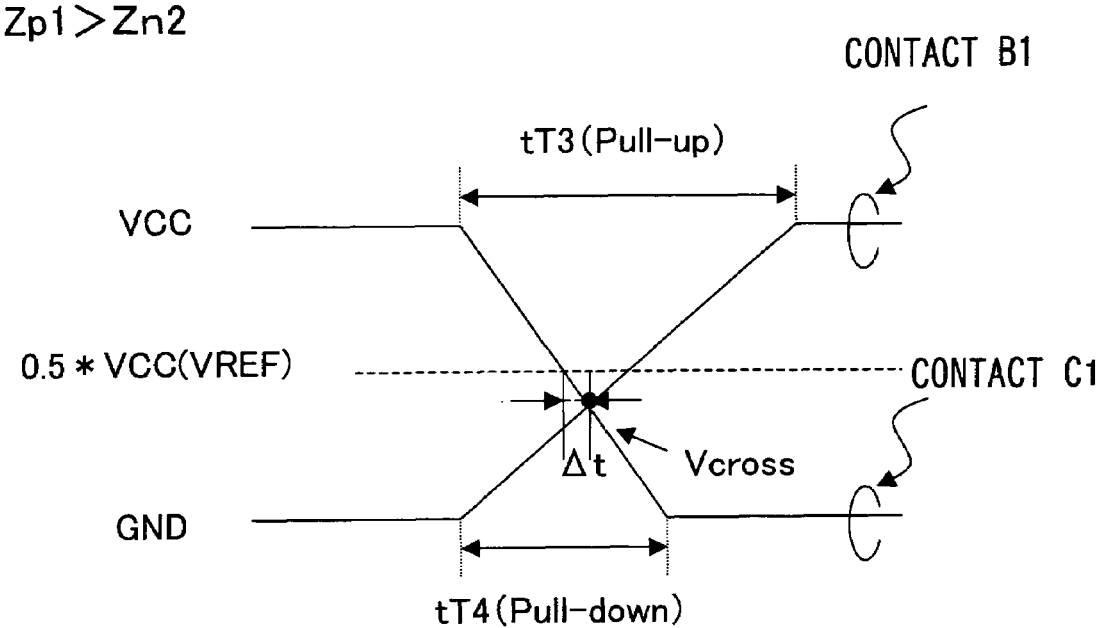
FIG. 7 is a diagram showing changes in the voltages at the node B1 and the node C1 when the impedance Zp1 of the buffer P1 is greater than the impedance Zn2 of the buffer N2 in FIG. 1.
Figure 8:
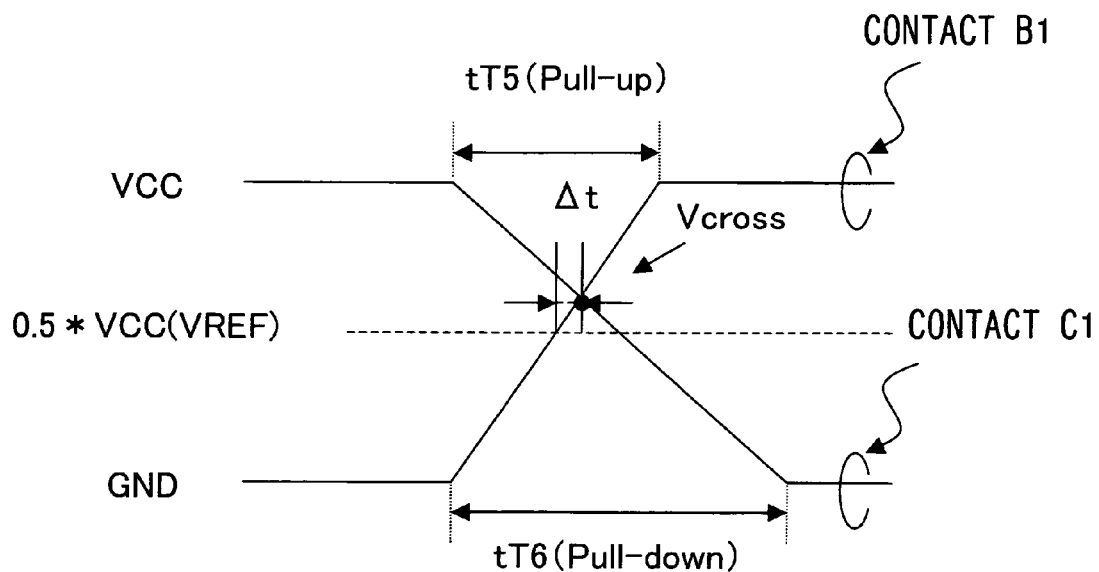
FIG. 8 is a diagram showing changes in the voltages at the node B1 and the node C1 when the impedance Zp1 of the buffer P1 is smaller than the impedance Zn2 of the buffer N2 in FIG. 1.

FIGS. 6 through 8 are diagrams explaining waveforms at the node B1 and the node C1 when the switches SW1 and SW2 in FIG. 1 are turned off (at a time of a normal operation). Referring to FIGS. 6 through 8, reference numeral Zp1 denotes the impedance of the pull-up buffer P1, and reference numeral Zn2 denotes the impedance of the pull-down buffer.

In case wherein the impedance Zp1 is equal to the impedance Zn2, as shown in FIG. 6, slew rates at a time of a rise or a fall become the same, and a voltage Vcross at a point where the waveform at the node B1 crosses the waveform at the node C1 becomes 0.5*VCC.

In case wherein the impedance Zp1 is greater than the impedance Zn2, as shown in FIG. 7, a slew rate at a time of a rise of the DQS signal becomes slower than a slew rate at a time of a fall of the DQSB signal (a rise time tT3 of the waveform at the node B1 becomes slower than a fall time tT4 at the node C1), and the voltage Vcross at the point where the waveform at the node B1 crosses the waveform at the node C1 becomes 0.5*VCC or lower. In this case, adjustment is made so that the impedance at the buffer N2 in FIG. 1 is increased (so that the size of the buffer is reduced).

In case wherein the impedance Zp1 is less than the impedance Zn2, as shown in FIG. 8, the slew rate at a time of the fall of the DQSB signal becomes slower than the slew rate at a time of the rise of the DQS signal (a fall time tT6 of the waveform at the node C1 becomes slower than a rise time tT5 at the node B1), and the voltage Vcross at the point where the waveform at the node B1 crosses the waveform at the node C1 becomes 0.5*VCC or higher. In this case, adjustment is made so that the impedance at the buffer N2 in FIG. 1 is reduced (so that the size of the buffer is increased).

Figure 9:
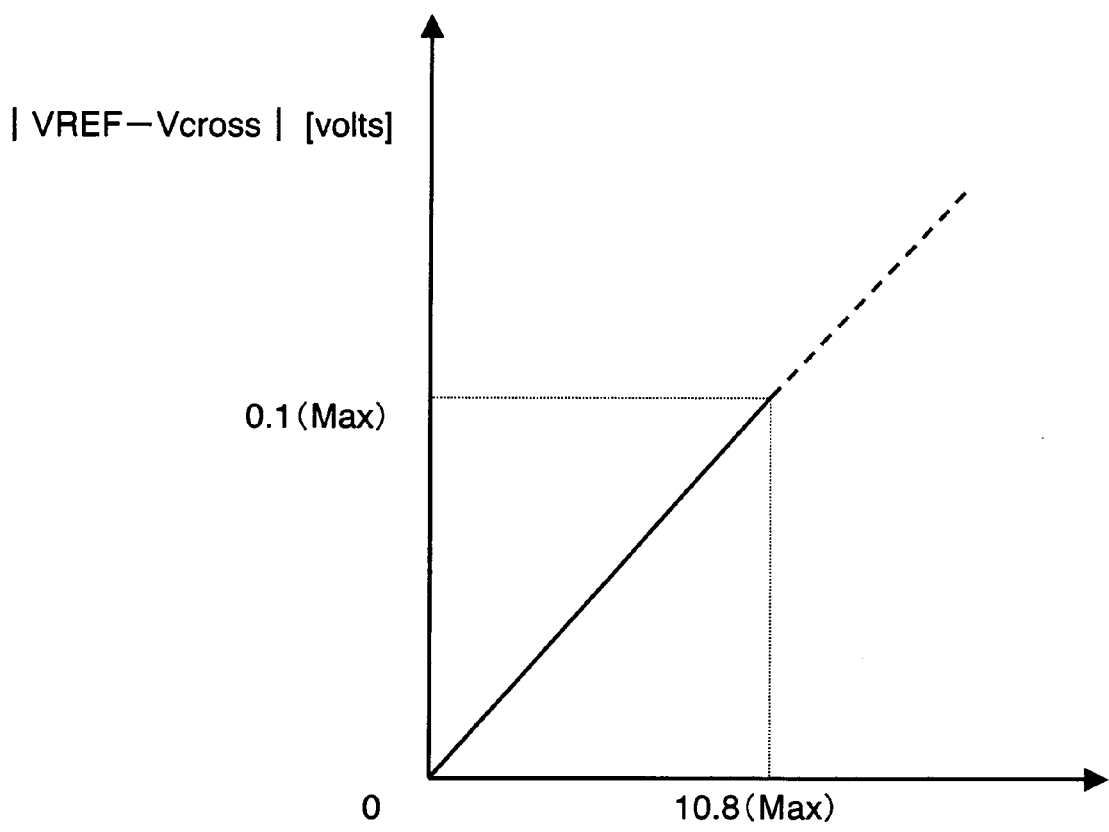
FIG. 9 is a diagram showing a correlation between a difference between the impedances Zp1 and Zn2 and a difference between a reference voltage VREF and a voltage Vcross at a point where the changes of the voltages at the contacts B1 and C1 in FIG. 1 cross.

From results of actual simulations, a relationship between a voltage VREF-Vcross and a voltage Zp1-Zn2 is expressed as shown in a graph in FIG. 9, and is given by the following expression:

$$|VREF\text{-}Vcross| \approx 9.25e\text{-}3 \times |Zp1\text{-}Zn2|$$

$$(0 \leq |Zp1\text{-}Zn2| \leq 10.8)$$

Figure 10:
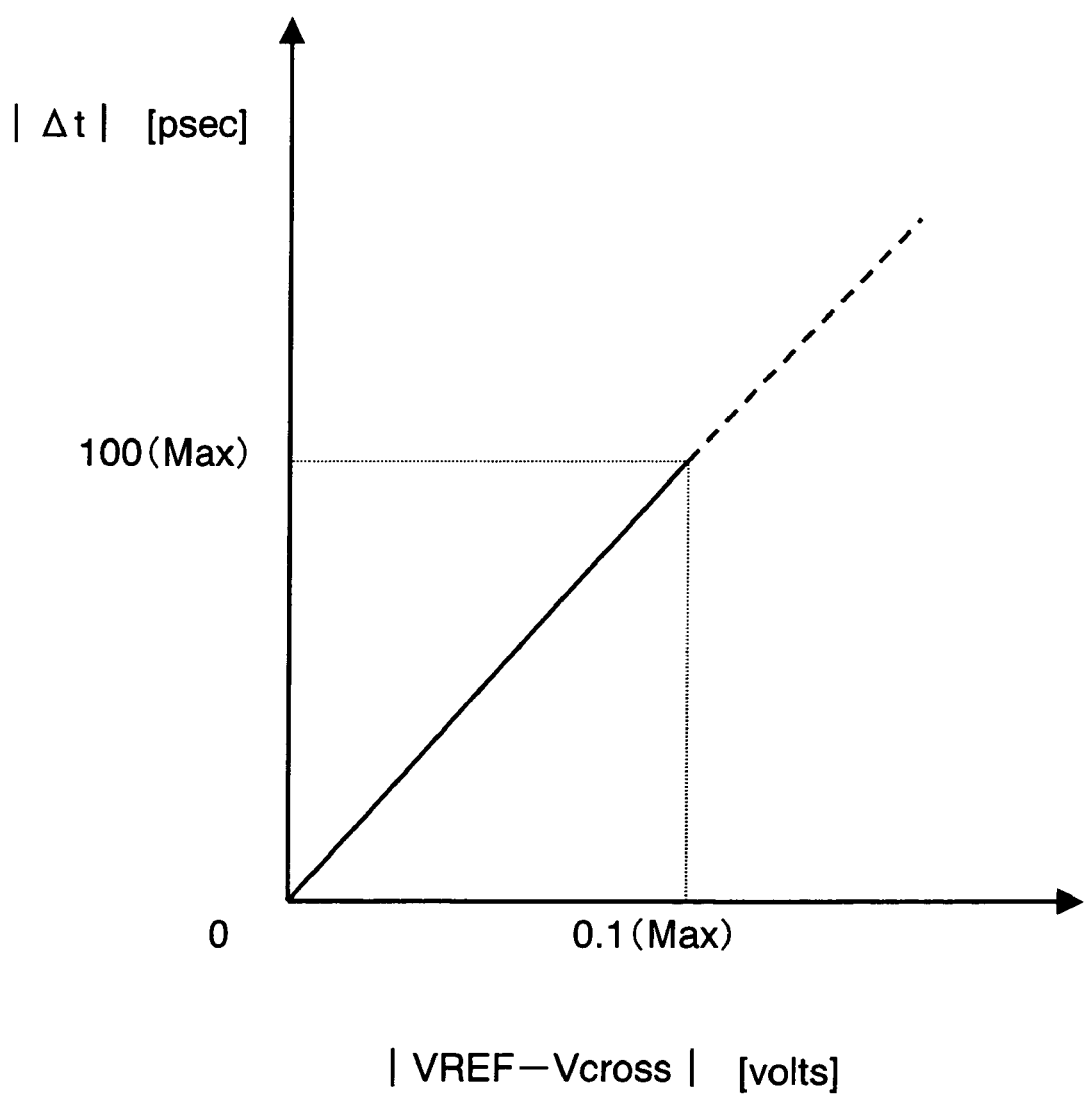
FIG. 10 is a diagram showing a correlation between the difference between the voltage Vcross and the voltage VREF and a time jitter Δt from a time at which the changes of the voltages at the contacts B1 and C1 in FIG. 1 cross, when the impedance Zp1 is equal to the impedance Zp2.
Figure 11:
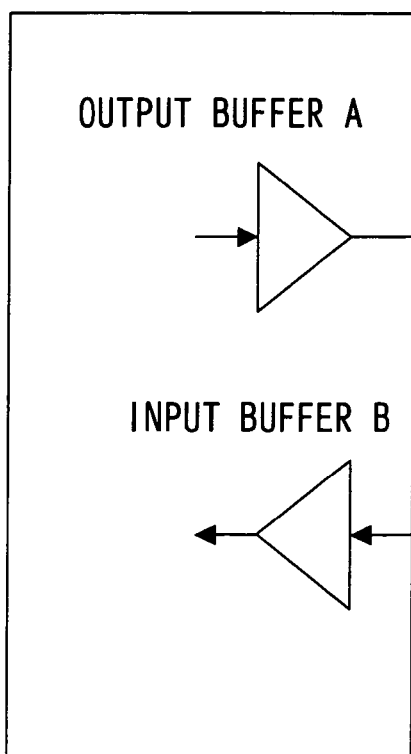
FIG. 11 is a diagram showing a conventional configuration.
Figure 11:
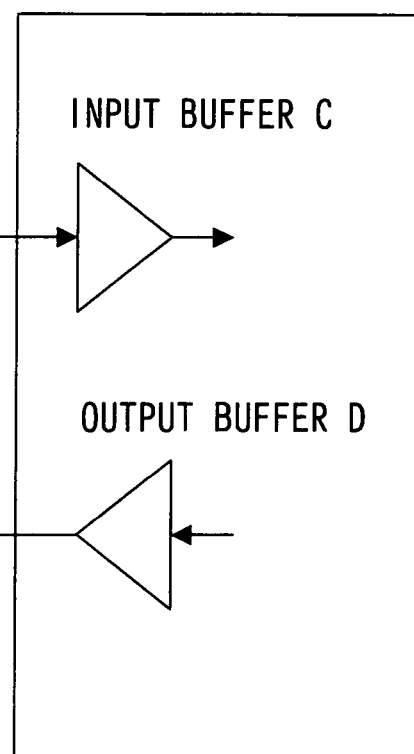
Figure 12A:
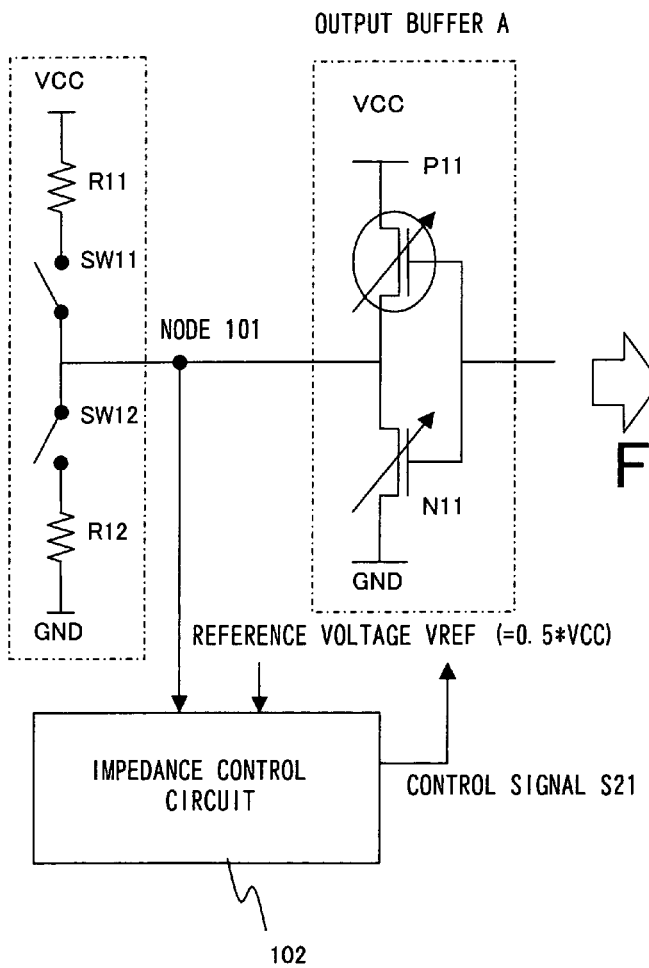
FIGS. 12A, 12B, and 12C are diagrams showing the conventional configuration in FIG. 11.
Figure 12B:
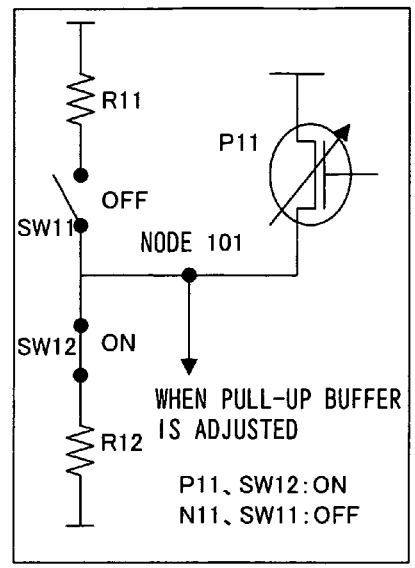
Figure 12C:
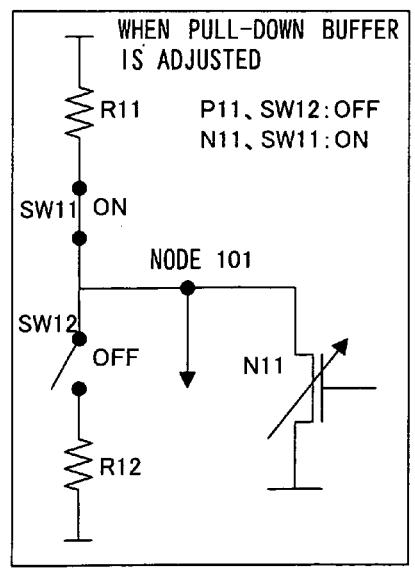

A relationship between a jitter ($\Delta t$) and the voltage VREF-Vcross is expressed as shown in a graph in FIG. 10, and is given by the following expression:

$$\Delta t| \approx 1.0e+3 \times |VREF\text{-}Vcross|$$

$$(0 \leq |VREF\text{-}Vcross| \leq 0.1)$$

Accordingly, just by improving the voltage at the point where the DQS signal crosses the DQSB signal by 10 mV (|Vref-Vcross|=10 mV), an effect of improvement of the jitter (|$\Delta t$|) of approximately 10 psec can be expected.

Figure 2:
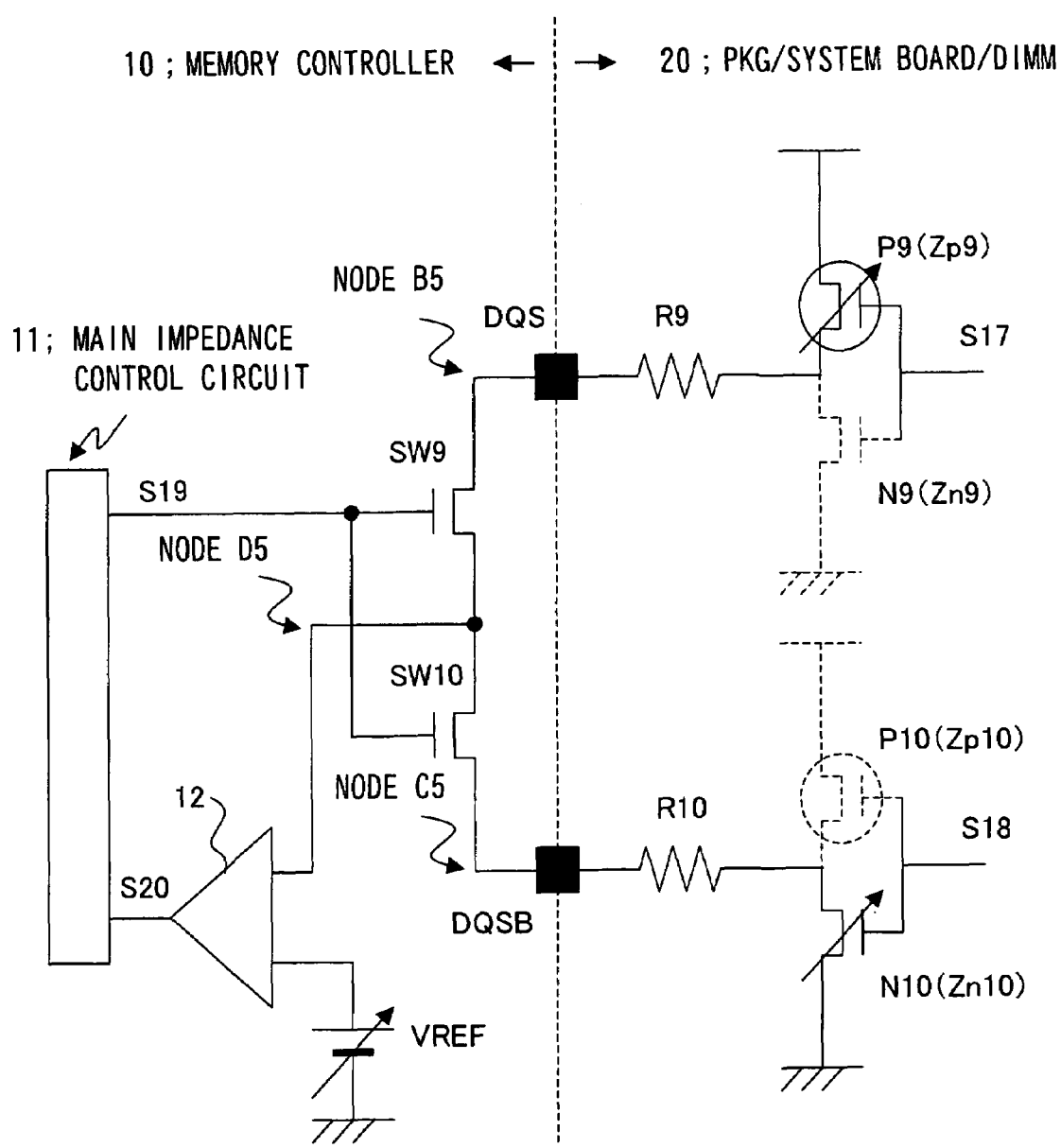
FIG. 2 is a diagram showing a circuit configuration of a second embodiment of the present invention.

Next, a second embodiment of the present invention will be described. FIG. 2 is a diagram showing the second embodiment of the present invention. The reference voltage VREF in the present embodiment is made adjustable, while the reference voltage VREF in the first embodiment is a fixed value. It is considered that in an actual product, the jitter does not always become a minimum when the voltage at the point where the DQS signal crosses the DQSB signal is 0.5*VCC due to characteristics of an internal circuit thereof, and that there is a slight offset. Then, by making the voltage of the reference voltage VREF adjustable, the voltage at the point where the DQS signal crosses the DQSB signal and where the jitter becomes the minimum can be controlled.

Figure 3:
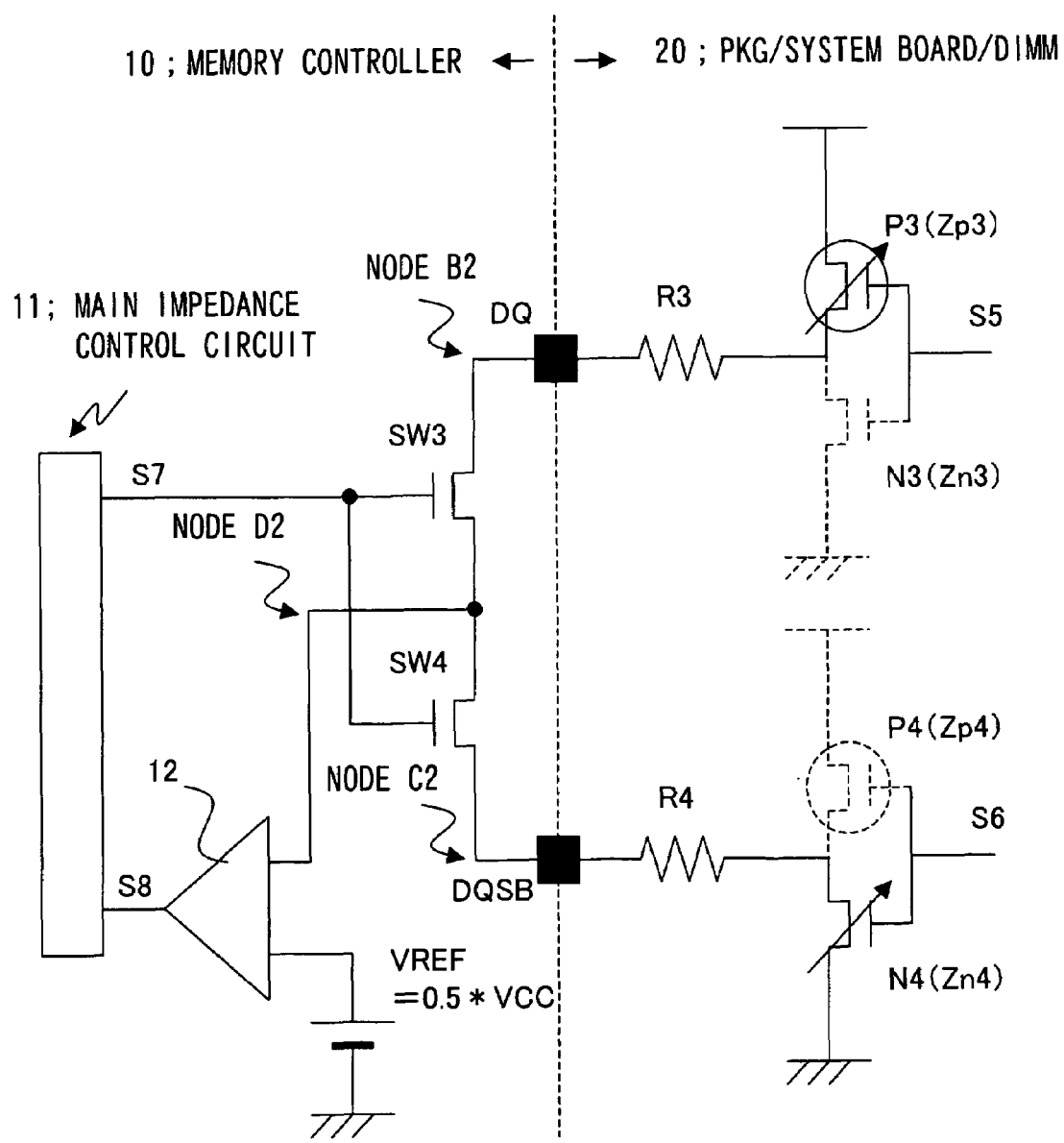
FIG. 3 is a diagram showing a circuit configuration of a third embodiment of the present invention.

Next, a third embodiment of the present invention will be described. FIG. 3 is a diagram showing a configuration of the third embodiment of the present invention. In the present embodiment, the DQ signal (data signal) which has the same phase as that of the DQS signal in the first embodiment is used in place of the DQS signal. As described before, in both cases where the drive (1) mode and the drive (0) mode of the OCD impedance adjusting mode are entered, the DQ signal and the DQS signal have the same phase. With this arrangement, layout design freedom can be improved.

In the first embodiment shown in FIG. 1, each of the switches SW1 and SW2 is constituted from the Nch transistor. The present invention is not of course limited to this configuration, thereby improving the layout design freedom.

Figure 4:
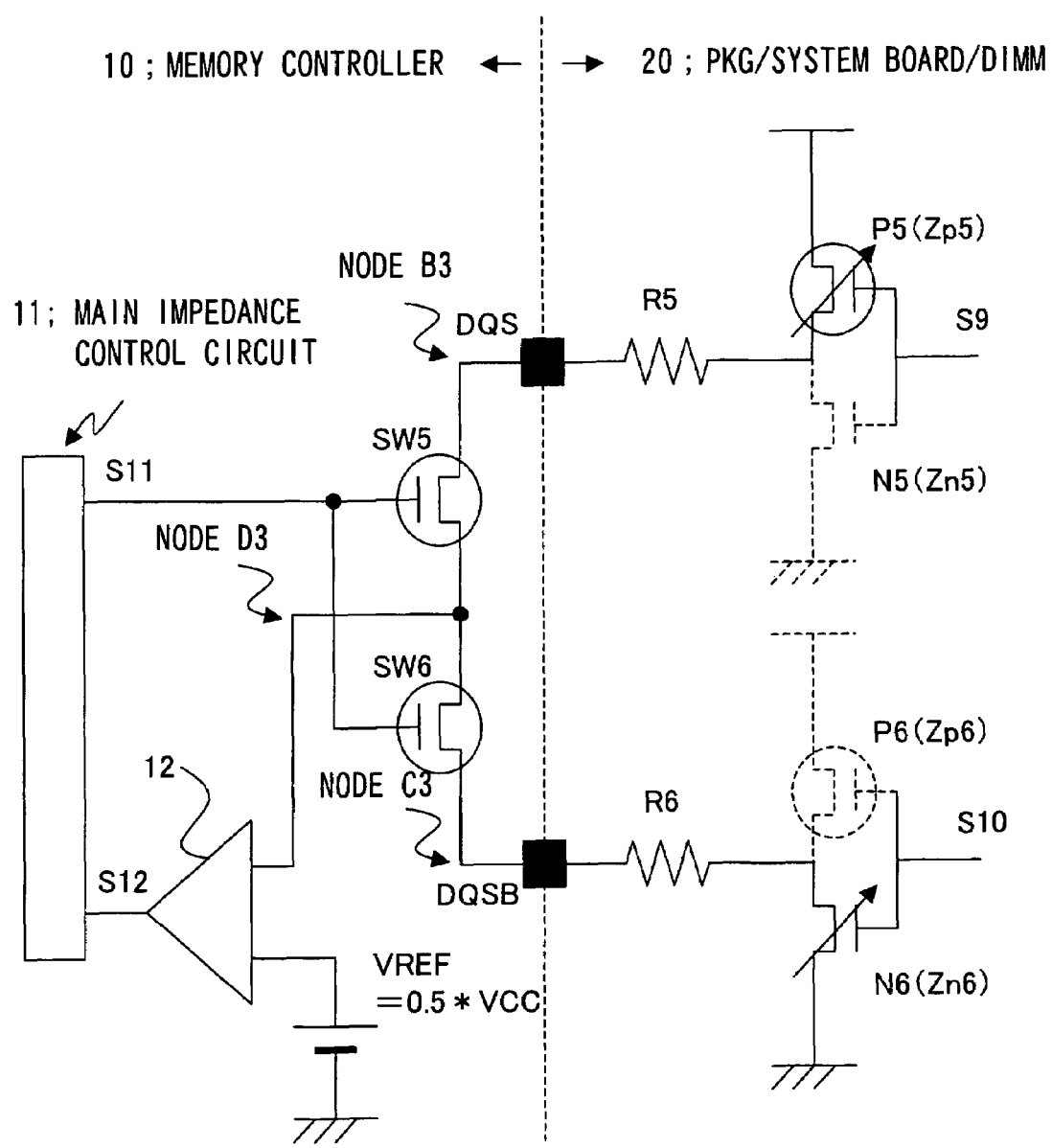
FIG. 4 is a diagram showing a circuit configuration of a fourth embodiment of the present invention.

FIG. 4 is a diagram showing a fourth embodiment of the present invention. In the present embodiment, each of the switches SW1 and SW2 in the first embodiment is constituted from the Pch transistor in place of the Nch transistor.

Figure 5:
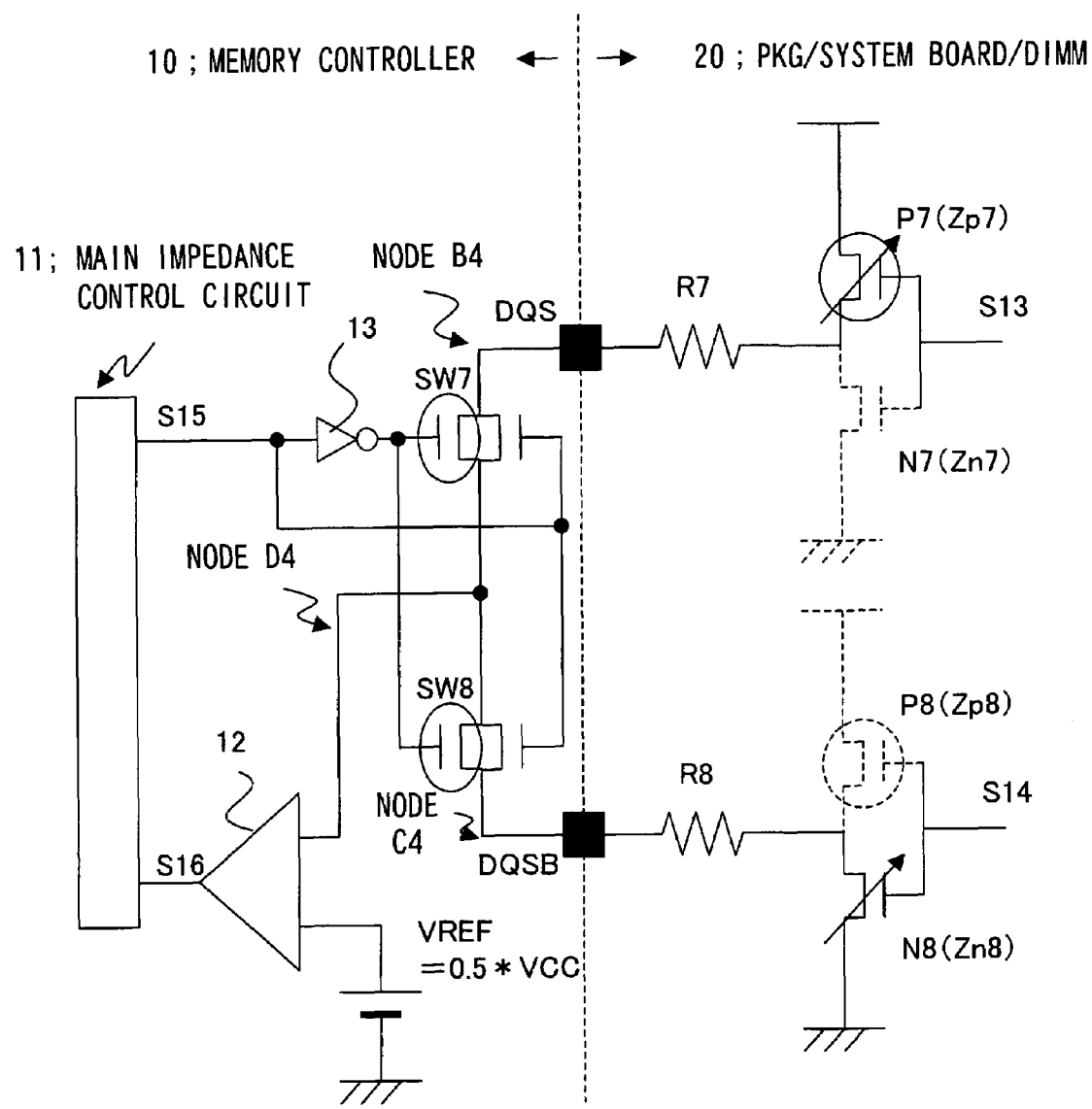
FIG. 5 is a diagram showing a circuit configuration of a fifth embodiment of the present invention.

FIG. 5 is a diagram showing a configuration of a fifth embodiment of the present invention. In this embodiment, each of the switches SW1 and SW2 in the first embodiment is constituted as a CMOS transfer gate in place of the Nch transistor.

According to the embodiments described above, by making the relative impedance adjustment using the OCD impedance adjusting function of the DDR2 memory and using the complementary output signals such as the differential strobe signals (DQS, DQSB) for data control from the DDR2 memory, the impedances of the pull-up output buffer and the pull-down output buffer can be adjusted without being influenced by the series resistance components on the package (PKG)/system board/DIMM.

With this arrangement, the voltage at the point where the differential strobe signals (DQS, DQSB) for data control of the DDR2 memory cross can be controlled.

Any arbitrary combination of the respective embodiments described above such as the combination of the second embodiment (in which the voltage VREF is made adjustable) and the fifth embodiment (that uses CMOS switches) can be of course performed.

The above description was made in connection with the embodiments described above. The present invention is not, however, limited to configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An impedance adjusting circuit for adjusting an impedance of a semiconductor device including first and second output buffers with respective impedances thereof variably controlled, said impedance adjusting circuit comprising:
   first and second terminals connected to outputs of said first and second output buffers, respectively;
   first and second switches connected in series between said first and second terminals;
   a comparator for comparing an input reference voltage with a voltage at a connection node between said first switch and said second switch; and
   a control circuit for on/off controlling said first and second switches and receiving a comparison result from said comparator to perform control for adjustably setting the impedance of said first buffer and/or the impedance of said second buffer.

2. The impedance adjusting circuit according to claim 1, wherein said control circuit turns on said first and second switches at a time of the impedance adjustment.

3. The impedance adjusting circuit according to claim 1, wherein the first and second signals are output respectively from said first and second output buffers in opposite phases to each other.

4. The impedance adjusting circuit according to claim 1, wherein said semiconductor device includes an OCD (Off-Chip Driver) impedance adjusting function, and wherein the impedances of said first and second output buffers are measured and adjusted using an OCD impedance adjusting mode.

5. The impedance adjusting circuit according to claim 4, wherein said semiconductor device comprises a memory, the first and second signals from said first and second output buffers of said memory being connected to said first and second terminals, respectively, through at least one of a package, a system board, and a memory module.

6. The impedance adjusting circuit according to claim 5, wherein said impedance adjusting circuit is included in a memory controller.

7. The impedance adjusting circuit according to claim 1, wherein said first output buffer includes:
   a first pull-up buffer and a first pull-down buffer, said first pull-up buffer and said first pull-down buffer being connected in series between first and second power supplies and receiving a first input signal in common, outputs of said first pull-up buffer and said first pull-down buffer being connected to said first terminal, impedances of said first pull-up buffer and said first pull-down buffer being adjustably controlled; and wherein
   said second output buffer includes:
   a second pull-up buffer and a second pull-down buffer, said second pull-up buffer and said second pull-down buffer being connected in series between said first and second power supplies and receiving a second input signal in common, outputs of said second pull-up buffer and said second pull-down buffer being connected to said second terminal, impedances of said second pull-up buffer and said second pull-down buffer being adjustably controlled.

8. The impedance adjusting circuit according to claim 5, wherein the first and second signals output from said first and second output buffers, respectively are complementary data control signals DQS and DQSB, respectively, the data control signals DQS and DQSB being output differentially from said memory in the OCD impedance adjusting drive mode.

9. The impedance adjusting circuit according to claim 5, wherein the first and second signals output from said first and second output buffers, respectively, are a data signal DQ and a complementary signal DQSB of a data control signal DQS, respectively, the data signal DQ and the signal DQSB being output from said memory in the OCD impedance adjusting mode.

10. The impedance adjusting circuit according to claim 1, wherein a length of wiring between an output terminal of said first output buffer and said first terminal and a length of wiring between an output terminal of said second output buffer and said second terminal are electrically made equal.

11. The impedance adjusting circuit according to claim 1, wherein the reference voltage is adjustably controlled.

* * * * *